(12) United States Patent
Nakagawa

(10) Patent No.: US 9,148,956 B2
(45) Date of Patent: Sep. 29, 2015

(54) BASE SUBSTRATE, ELECTRONIC DEVICE, AND METHOD OF MANUFACTURING BASE SUBSTRATE

(71) Applicant: Seiko Epson Corporation, Tokyo (JP)

(72) Inventor: Naohiro Nakagawa, Suwa (JP)

(73) Assignee: Seiko Epson Corporation (JP)

( * ) Notice: Subject to any disclaimer, the term of this patent is extended or adjusted under 35 U.S.C. 154(b) by 233 days.

(21) Appl. No.: 13/868,471

(22) Filed: Apr. 23, 2013

(65) Prior Publication Data

US 2013/0286610 A1    Oct. 31, 2013

(30) Foreign Application Priority Data

Apr. 27, 2012  (JP) ................. 2012-104087

(51) Int. Cl.
| | |
|---|---|
| H05K 1/11 | (2006.01) |
| H05K 3/10 | (2006.01) |
| H05K 3/40 | (2006.01) |
| H05K 3/42 | (2006.01) |
| H03H 9/05 | (2006.01) |
| H03H 9/10 | (2006.01) |
| H05K 1/03 | (2006.01) |
| H05K 3/00 | (2006.01) |

(52) U.S. Cl.
CPC .............. *H05K 1/115* (2013.01); *H03H 9/0514* (2013.01); *H03H 9/1021* (2013.01); *H05K 1/113* (2013.01); *H05K 3/4038* (2013.01); *H05K 3/426* (2013.01); *H05K 1/0306* (2013.01); *H05K 3/0029* (2013.01); *H05K 2201/017* (2013.01); *H05K 2201/09563* (2013.01); *H05K 2201/10083* (2013.01); *H05K 2203/085* (2013.01); *H05K 2203/107* (2013.01); *H05K 2203/1147* (2013.01); *Y10T 29/49165* (2015.01)

(58) Field of Classification Search
CPC ..... H05K 1/115; H05K 3/4038; H05K 3/426; H05K 1/113; H05K 2201/09563; H05K 2203/107; H05K 3/0029; H05K 2201/017; H05K 2201/10083; H05K 2203/085; H05K 2203/1147; H05K 1/0306; H03H 9/0514; H03H 9/1021; Y10T 29/49165
USPC ..................... 174/262–266; 29/852
See application file for complete search history.

(56) References Cited

U.S. PATENT DOCUMENTS

| | | | | |
|---|---|---|---|---|
| 5,517,758 | A * | 5/1996 | Nakamura ...................... 29/852 |
| 6,930,258 | B1* | 8/2005 | Kawasaki et al. ............. 174/264 |
| 2006/0065534 | A1* | 3/2006 | Nakai et al. ................... 205/118 |
| 2006/0191709 | A1* | 8/2006 | Kim et al. ..................... 174/255 |
| 2010/0065324 | A1* | 3/2010 | Liu et al. ....................... 174/266 |
| 2010/0220448 | A1* | 9/2010 | Nomura ......................... 361/746 |

FOREIGN PATENT DOCUMENTS

| | | |
|---|---|---|
| JP | 2-501253 | 4/1990 |
| JP | 02-209798 | 8/1990 |
| JP | 03-205891 | 9/1991 |

(Continued)

*Primary Examiner* — Hoa C Nguyen
(74) *Attorney, Agent, or Firm* — Harness, Dickey & Pierce, P.L.C.

(57) ABSTRACT

A base substrate includes an insulator board comprising through holes penetrating between two opposed principal surfaces, penetrating electrodes provided within the through holes, and intermediate layers sandwiched between inner surfaces of the through holes and the penetrating electrodes and having surfaces with smaller concavities and convexities than those of the inner surfaces at the penetrating electrode sides.

9 Claims, 14 Drawing Sheets

(56) References Cited

FOREIGN PATENT DOCUMENTS

| JP | 2007-180924 | 7/2007 |
|----|-------------|--------|
| JP | 2009-206234 | 9/2009 |
| JP | 2010-206322 | 9/2010 |
| JP | 2011-159947 | 8/2011 |
| JP | 2011-205010 | 10/2011 |
| WO | 89-02697 | 3/1989 |

* cited by examiner

BASE SUBSTRATE, ELECTRONIC DEVICE, AND METHOD OF MANUFACTURING BASE SUBSTRATE

BACKGROUND

1. Technical Field

The present invention relates to a base substrate, an electronic device, and a method of manufacturing the base substrate.

2. Related Art

In related art, electronic devices in which electronic components such as piezoelectric elements are housed in packages have been known. A general electronic device air-tightly houses a piezoelectric element in a housing space (internal space) of a package formed by bonding a base substrate and a lid. Further, the base substrate has a ceramics board, connecting electrodes formed on the upper surface of the ceramics board, mounting electrodes formed on the lower surface of the ceramics board, and penetrating electrodes formed through the ceramics board for connecting the connecting electrodes and the mounting electrodes.

Further, as the configuration of the base substrate, a configuration disclosed in Patent Document 1 (JP-A-2007-180924) has been known. A base substrate in Patent Document 1 has a board in which through holes are formed, connecting terminals formed on the upper surface of the board, mounting electrodes formed on the lower surface of the board, and penetrating electrodes formed on the inner surfaces of the through holes for connecting the connecting electrodes and the mounting electrodes. In the base substrate, the penetrating electrodes are formed in films, and the through holes are not filled depending on the penetrating electrodes. Accordingly, in Patent Document 1, the through holes are filled with sealing members and air-tightly sealed.

However, in the base substrate, there is a problem that gaps are easily caused between the through holes and the penetrating electrodes and between the penetrating electrodes and the sealing members, and the outside and the inside of the housing space communicate via the gaps and the air-tightness of the housing space is lost. Further, there is another problem that the penetrating electrodes are formed in thin films, and disconnection is easily caused. Particularly, on the inner surfaces of the through holes, minute concavities and convexities caused at the formation exist and, when the penetrating electrodes are formed by sputtering or evaporation, it is hard for the materials to attach to the concavities behind the convexities and it is impossible to form uniform films. On this account, the problem that disconnection is easily caused becomes more significant.

SUMMARY

An advantage of some aspects of the invention is to provide a base substrate having advantageous air-tightness and electrical characteristics, an electronic device with high reliability using the base substrate, and a method of manufacturing a base substrate having advantageous air-tightness and electrical characteristics.

The invention can be implemented as the following forms or application examples.

APPLICATION EXAMPLE 1

A base substrate according to this application example of the invention includes an insulator board having a through hole penetrating between two opposed principal surfaces, a penetrating electrode provided within the through hole, and an intermediate layer sandwiched between an inner surface of the through hole and the penetrating electrode and comprising a surface with smaller concavities and convexities than those of the inner surface at the penetrating electrode side.

The concavities and convexities on the inner surface of the through hole are filled with the intermediate layer, and the penetrating electrode may be formed within the through hole more reliably. Therefore, disconnection of the penetrating electrode, production of a gap between the penetrating electrode and the inner surface of the through hole may be prevented, and the base substrate that may exert advantageous air-tightness and electrical characteristics may be provided.

APPLICATION EXAMPLE 2

In the base substrate according to the application example of the invention, it is preferable that a principal surface-side electrode electrically connected to the penetrating electrode and covering and opening of the through hole is provided at least at a side of one principal surface of the two principal surfaces.

Thereby, the through hole is closed by the principal surface-side electrode, and thus, the air-tightness may be secured more reliably.

APPLICATION EXAMPLE 3

In the base substrate according to the application example of the invention, it is preferable that the intermediate layer extends to between the principal surface-side electrode and the one principal surface.

Thereby, for example, the intermediate layer may intervene between the principal surface-side electrode and the insulator board, and thus, the adhesion between the principal surface-side electrode and the insulator board may be improved.

APPLICATION EXAMPLE 4

In the base substrate according to the application example of the invention, it is preferable that the insulator board contains a glass material.

Thereby, the intermediate layer may be formed more easily and the surface of the intermediate layer may be made smoother.

APPLICATION EXAMPLE 5

An electronic device according to this application example of the invention includes the base substrate according to the application example of the invention, and an electronic component mounted on the base substrate.

Thereby, the electronic device with high reliability may be obtained.

APPLICATION EXAMPLE 6

A method of manufacturing a base substrate according to this application example of the invention includes preparing an insulator board, forming a through hole penetrating between two opposed principal surfaces of the insulator board and an intermediate layer bonded to an inner surface of the through hole and comprising a surface with smaller concavities and convexities than those of the inner surface while maintaining a penetrating state of the through hole, and forming a penetrating electrode within the through hole by depositing a metal material on the intermediate layer.

Thereby, the disconnection of the penetrating electrode, the production of a gap between the penetrating electrode and the inner surface of the through hole may be prevented, and the base substrate that may exert advantageous air-tightness and electrical characteristics may be easily manufactured.

APPLICATION EXAMPLE 7

In the method of manufacturing the base substrate according to the application example of the invention, it is preferable that the insulator board includes a ceramics material, and forming the through hole and the intermediate layer includes melting and hardening a part of the insulator board.

Thereby, the intermediate layer may be easily formed.

APPLICATION EXAMPLE 8

In the method of manufacturing the base substrate according to the application example of the invention, it is preferable that forming the through hole and the intermediate layer includes forming the through hole and the intermediate layer by irradiating the insulator substrate with laser.

Thereby, the through hole and the intermediate layer may be formed in the same process, and the number of manufacturing steps may be reduced. Further, the intermediate layer may be easily formed.

BRIEF DESCRIPTION OF THE DRAWINGS

The invention will be described with reference to the accompanying drawings, wherein like numbers reference like elements.

DESCRIPTION OF EXEMPLARY EMBODIMENTS

As below, a base substrate, a method of manufacturing the base substrate, an electronic device, and an electronic apparatus of the invention will be explained in detail with reference to embodiments shown in the accompanying drawings.

1. Electronic Device

First Embodiment

First, the first embodiment of an electronic device to which a base substrate of the invention is applied (an electronic device of the embodiment of the invention) will be explained.

Figure 1:
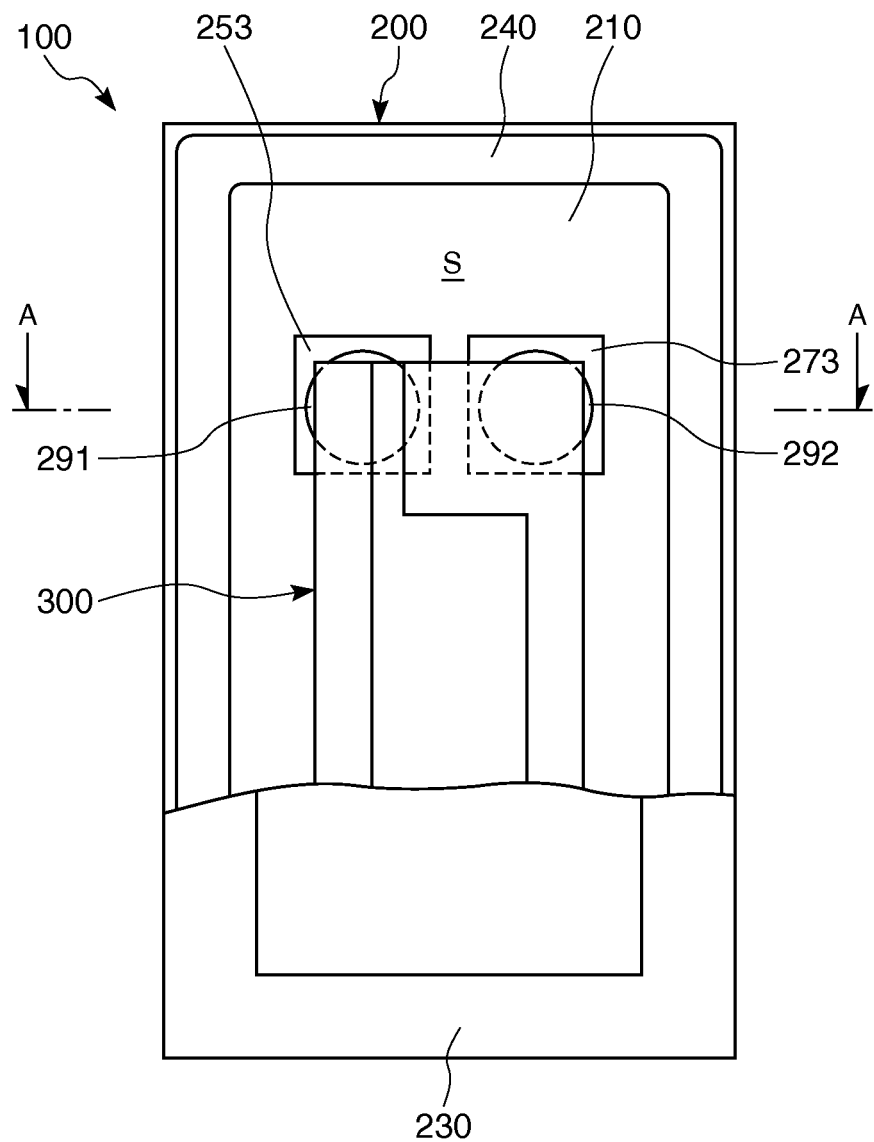
FIG. 1 is a plan view of an electronic device according to a first embodiment of the invention.
Figure 2:
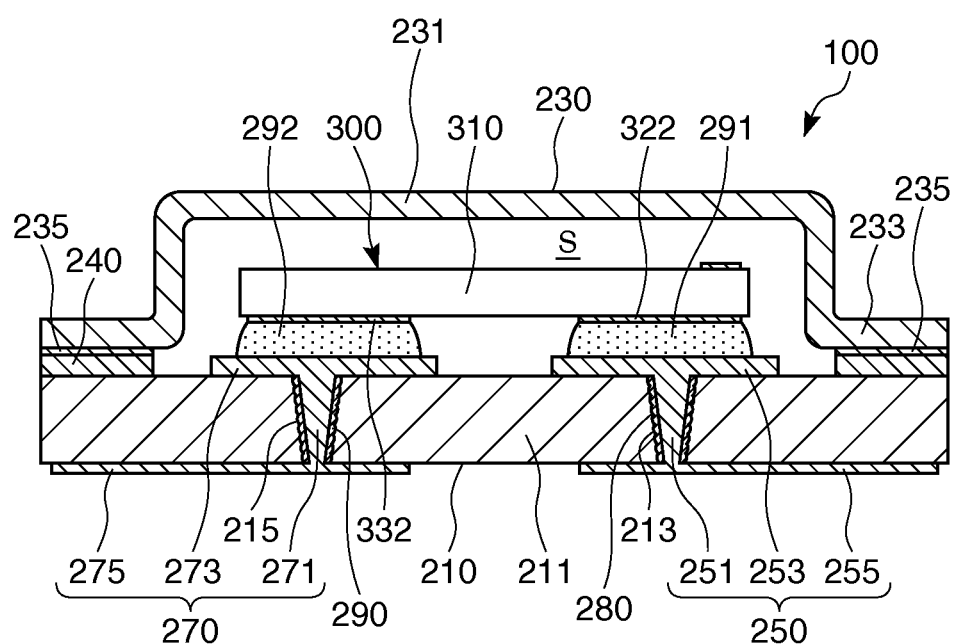
FIG. 2 is a sectional view along line A-A in FIG. 1.
Figure 3A:
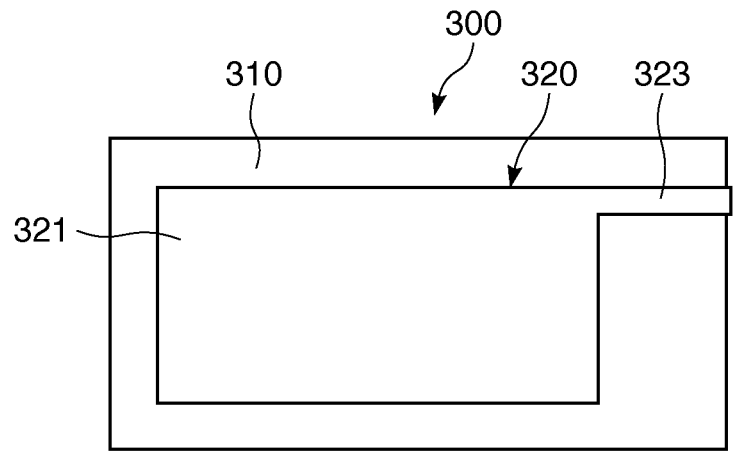
FIGS. 3A and 3B are plan views of a vibrating element of the electronic device shown in FIG. 1.
Figure 3B:
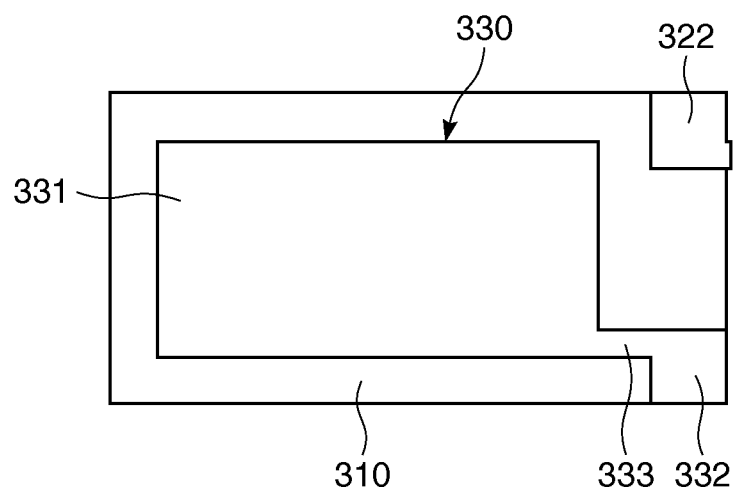
Figure 4:
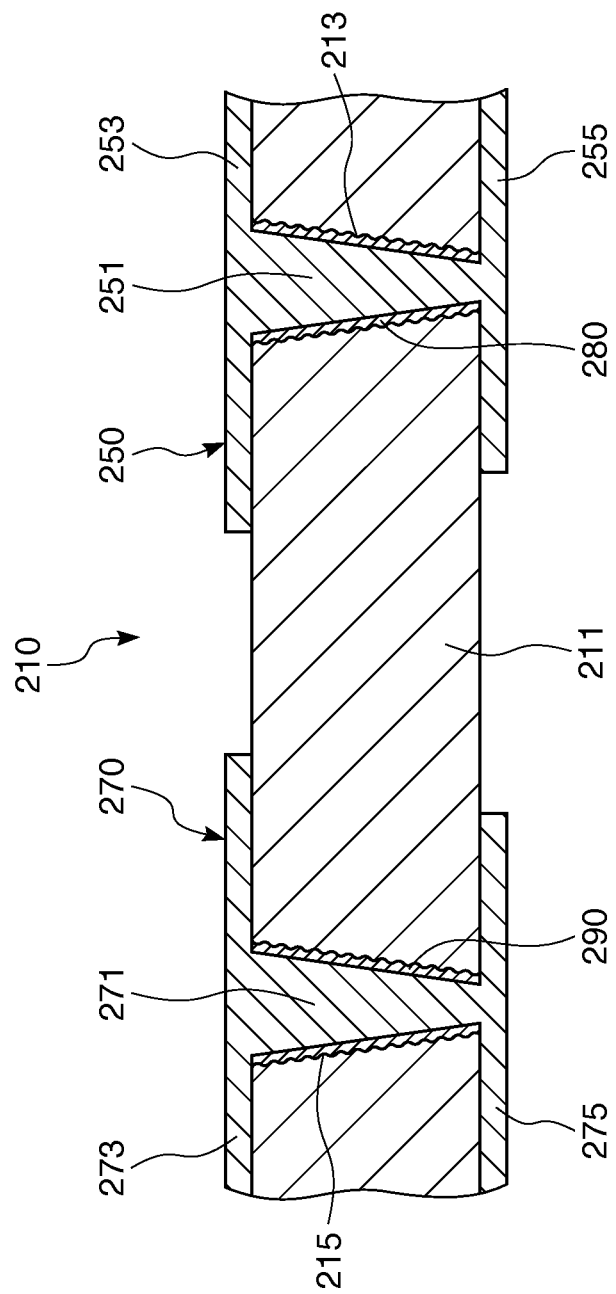
FIG. 4 is a partially enlarged sectional view of a base substrate of the electronic device shown in FIG. 1.

FIG. 1 is a plan view of an electronic device according to the first embodiment of the invention, FIG. 2 is a sectional view along line A-A in FIG. 1, FIGS. 3A and 3B are plan views of a vibrating element of the electronic device shown in FIG. 1, FIG. 4 is a partially enlarged sectional view of a base substrate of the electronic device shown in FIG. 1, and FIGS. 5A to 5C, 6A to 6C, and 7A and 7B are diagrams for explanation of a method of manufacturing the base substrate shown in FIG. 4. Note that, as below, for convenience of explanation, the explanation will be made with the upside in FIG. 1 as "upper" and the downside as "lower" (the same will apply to the other drawings).

As shown in FIG. 1, an electronic device 100 has a package 200, and a vibrating element 300 as an electronic component housed within the package 200.

Vibrating Element

FIG. 3A is a plan view of the vibrating element 300 as seen from above, and FIG. 3B is a perspective view (plan view) of the vibrating element 300 as seen from above.

As shown in FIGS. 3A and 3B, the vibrating element 300 includes a piezoelectric board 310 having a plan view shape of a rectangular plate, and a pair of exciting electrodes 320, 330 formed on the surface of the piezoelectric board 310.

The piezoelectric board 310 is a quartz raw board that mainly performs thickness slip vibration. In the embodiment, as the piezoelectric board 310, a quartz raw board cut out at a cut angle called AT cut is used. Note that the AT cut refers to cutting out such that the board may have a principal surface (principal surface containing the X-axis and the Z'-axis) obtained by rotation of a plane containing the X-axis and the Z-axis as crystal axes of quartz (Y-plane) from the Z-axis around the X-axis to about 35 degrees 15 minutes in the counter-clockwise direction.

The piezoelectric board 310 having the configuration has the longitudinal direction aligned with the X-axis as the crystal axis of quartz.

The exciting electrode 320 has an electrode part 321 formed on the upper surface of the piezoelectric board 310, a bonding pad 322 formed on the lower surface of the piezoelectric board 310, and a wire 323 that electrically connects the electrode part 321 and the bonding pad 322. On the other hand, the exciting electrode 330 has an electrode part 331 formed on the lower surface of the piezoelectric board 310, a bonding pad 322 formed on the lower surface of the piezoelectric board 310, and a wire 333 that electrically connects the electrode part 331 and the bonding pad 332.

The electrode parts 321, 331 are provided to be opposed via the piezoelectric board 310, and have nearly the same shape as each other. That is, in the plan view of the piezoelectric board 310, the electrode parts 321, 331 are formed to be located to overlap with each other so that their outlines may coincide with each other. Further, the bonding pads 322, 332 are formed apart in the end part at the right side of FIG. 3C on the lower surface of the piezoelectric board 310.

These exciting electrodes 320, 330 may be formed by depositing a foundation layer of nickel (Ni) or chromium (Cr) on the piezoelectric board 310 by evaporation or sputtering, for example, then, depositing an electrode layer of gold (Au) on the foundation layer by evaporation or sputtering, and then, patterning them in desired shapes using a photolithography and various etching technologies. The foundation layer is formed, and thereby, the adhesiveness between the piezoelectric board 310 and the electrode layer is improved and the vibrating element 300 with high reliability is obtained.

Note that, as the configuration of the exciting electrodes 320, 330, not limited to the above described configuration, but, for example, the foundation layer may be omitted or their constituent material may be another material having conductivity (e.g., various metal materials including silver (Ag), copper (Cu), tungsten (W), molybdenum (Mo), or the like).

This vibrating element 300 is fixed to the package 200 via a pair of conducting adhesive agents 291, 292.

Package

As shown in FIGS. 1 and 2, the package 200 has a base substrate (a base substrate of the embodiment of the invention) 210 in a plate shape, a lid 230 in a cap shape having a recess part opening to the lower side, and a metalization layer 240 intervening between the base substrate 210 and the lid 230 and bonding them. In the package 200, the opening of the recess part is covered by the base substrate 210, and thereby, an air-tight housing space S for housing the above described vibrating element 300 is formed.

The lid 230 has a main body 231 in a cylindrical shape with a bottom, and a flange 233 formed on the lower end of the main body 231 (i.e., around the opening of the main body 231). Further, on the lower surface of the flange 233, a brazing filler metal 235 is provided in a film to surround the opening. This lid 230 is bonded to the base substrate 210 by welding of the brazing filler metal 235 and the metalization layer 240. As the brazing filler metal 235, not particularly limited, but gold solder, silver solder, or the like may be used. The silver solder is preferably used. Further, as the melting point of the brazing filler metal 235, not particularly limited, but the temperature from 800° C. to 1000° C. is preferable.

Furthermore, as the constituent material of the lid 230, not particularly limited, but a member having a linear expansion coefficient approximately equal to that of the constituent material of the base substrate 210 (an insulator board 211) is preferable. For example, when the insulator board 211 is a ceramics board, which will be described later, the lid may be formed using an alloy of kovar or the like.

FIG. 4 is the enlarged sectional view of the base substrate 210. As shown in the drawing, the base substrate 210 has the plate-like insulator board 211 with two through holes 213, 215 formed therein, intermediate layers 280, 290 formed on the inner surfaces of the respective through holes 213, 215, and a pair of electrodes 250, 270 formed on the insulator board 211.

The insulator board 211 of the embodiment includes a ceramics board. This ceramics board, for example, the insulator board 211 is obtained by preparing ceramics powder (ceramics material) and glass powder (glass material), shaping the material as mixture of these powder raw materials and binder in a sheet shape to obtain a green sheet, and sintering the green sheet. As a mixture ratio of the ceramics material and the glass material, not particularly limited, but, for example, a ratio by weight of about 1:1 is preferable.

The ceramics materials include, for example, $Al_2O_3$, $SiO_2$, $MgO$, $MgO.SiO_2$, $2MgO.SiO_2$, composite oxides having Perovskite structures of $TiO_2$, $BaTiO_3$, $Ba_xSr_{1-x}TiO_3$, $SrTiO_3$, $CaTiO_3$, $PbZr_xTi_{1-x}$, $Pb_{1-x}La_yZrTi_{1-x}O_3$, $SrBi_2TaO_3$, other ferroelectric materials, or $MgTiO_3$, $Ba(Mg_{1/3}Ta_{2/3})O_3$, $Ba(Zn_{1/3}Ta_{2/3})O_3$, $Ba(Ni_{1/3}Ta_{2/3})$, $Ba(Co_{1/3}Ta_{2/3})$, $BaNd_2Ti_4O_{12}$, $Ba_2Ti_9O_{20}$, $LaAlO_3$, $PrAlO_3$, $SmAlO_3$, $YAlO_3$, $GdAlO_3$, $DyAlO_3$, $ErAlO_3$, $Sr(Zn_{1/3}Ta_{2/3})O_3$, $Sr(Ni_{1/3}\ Ta_{2/3})O_3$, $Sr(Co_{1/3}Ta_{2/3})O_3$, $Sr(Mg_{3/3}Ta_{2/3})O_3$, $Sr(Ca_{1/3}Ta_{2/3})O_3$, $Ba_2Ti_9O_{20}$, $Ba(Co_{1/3}Nb_{2/3})O_3$, or the like.

Further, the glass materials include crystallized glass, amorphous glass, specifically, glass materials containing $SiO_2$, $Al_2O_3$, RO (R is Mg, Ca, Sr, Ba), and specifically, $SiO_2$—BaO based, $SiO_2$—$Al_2O_3$—BaO based, $SiO_2$—$Al_2O_3$—BaO—$Ba_2O_3$ based, $SiO_2$—$Al_2O_3$—BaO—ZnO—$Ba_2O_3$ based glass, Bi-based glass, and glass consisting primarily of them.

Here, the formation of the through holes 213, 215 in the insulator board 211 is performed after the above described sintering processing. Thereby, the through holes 213, 215 may be formed with advantageous dimensions and position accuracy. There is a method of forming the through holes 213, 215 in the green sheet before sintering processing by punching or the like, however, in this method, due to contraction and deflection of the sheet at sintering processing, the dimensions of the through holes 213, 215 and the positional relationship between each other (distance apart from each other or the like) deviate from the designed values, and advantageous dimensions and position accuracy can not be exerted. On the other hand, according to the method of forming the through holes 213, 215 after sintering processing, the above described problem does not occur and the through holes 213, 215 may be formed with the advantageous dimensions and position accuracy.

As the method of forming the through holes 213, 215, not particularly limited, but a method of laser processing, sandblasting, etching, punching, or the like may be used, and the laser processing is used in the embodiment. According to the laser processing, as will be described later, the intermediate layers 280, 290 may be formed at the same time (in the same process) with the through holes 213, 215.

Note that, when the through holes 213, 215 are formed by laser processing, the through holes 213, 215 are formed in tapered shapes (conical shapes) in which the opening at the upper surface side as the laser irradiation side is larger in diameter than the opening at the lower surface side. The diameters of the through holes 213, 215 are not particularly limited, but it is preferable that the diameter of the opening at the upper surface side is about from 50 μm to 100 μm and the diameter of the opening at the lower surface side is about from 20 μm to 50 μm. Thereby, the sufficiently small through holes 213, 215 are obtained, and downsizing of the electronic device 100 may be realized.

As shown in FIG. 4, the electrode 250 includes a penetrating electrode 251 formed within the through hole 213 to fill the through hole 213, a connecting electrode (principal-side electrode) 253 formed on the upper surface of the insulator board 211 to overlap with the penetrating electrode 251 (cover the penetrating electrode 251), and a mounting electrode (principal-side electrode) 255 formed on the lower surface of the insulator board 211 to overlap with the penetrating electrode 251. In the electrode 250 having the configuration, the connecting electrode 253 and the mounting electrode 255 are electrically connected via the penetrating electrode 251.

Similarly, the electrode 270 includes a penetrating electrode 271 formed within the through hole 215 to fill the through hole 215, a connecting electrode (principal-side electrode) 273 formed on the upper surface of the insulator board 211 to overlap with the penetrating electrode 271, and amounting electrode (principal-side electrode) 275 formed on the lower surface of the insulator board 211 to overlap with the penetrating electrode 271. In the electrode 270 having the configuration, the connecting electrode 273 and the mounting electrode 275 are electrically connected via the penetrating electrode 271.

As the constituent material of these electrodes 250, 270, not particularly limited, but, for example, a metal material such as gold (Au), gold alloy, platinum (Pt), aluminum (Al), aluminum alloy, silver (Ag), silver alloy, chromium (Cr), chromium alloy, copper (Cu), molybdenum (Mo), niobium (Nb), tungsten (W), iron (Fe), titanium (Ti), cobalt (Co), zinc (Zn), or zirconium (Zr) may be used.

The formation of the electrodes 250, 270 may be performed, not particularly limited, but using evaporation, sputtering, screen printing, plating processing, or the like, and preferably using the plating processing. Further, as the plating processing, either of electrolytic plating processing or non-electrolytic plating processing may be used, and the electrolytic plating processing is preferably used. Thereby, the respective parts of the electrode 250, i.e., the penetrating electrode 251, the connecting electrode 253, and the mounting electrode 255 may be integrally formed at the same time (the same applies to the electrode 270), and thus, the electrodes 250, 270 may be formed more easily. Further, in the method of forming the electrodes 250, 270 by attaching the scattered material to the insulator board 211 like evaporation and sputtering, the material does not sufficiently enter the through holes 213, 215, and the formation of the penetrating electrodes 251, 271 may be insufficient. However, in the plating processing, the plating material (the above described metal material) may be grown from inside of the through holes 213, 215, and the through holes 213, 215 may be reliably filled with the plating material. Therefore, according to the plating processing, the desired penetrating electrodes 251, 271, i.e., the penetrating electrodes 251, 271 with which production of gaps (gaps that can be paths of the base) in the boundary parts between the intermediate layers 280, 290 and themselves or inside are suppressed may be reliably formed.

As shown in FIG. 4, the intermediate layer 280 is formed between the inner surface of the through hole 213 and the penetrating electrode 251, and the intermediate layer 290 is formed between the inner surface of the through hole 215 and the penetrating electrode 271. As below, for the explanation of the intermediate layers 280, 290, the intermediate layer 280 will be representatively explained and the explanation of the intermediate layer 290 will be omitted because they have the same configuration as each other.

The intermediate layer 280 has a function of intervening between the inner surface of the through hole 213 and the penetrating electrode 251 (being sandwiched between the inner surface of the through hole 213 and the penetrating electrode 251), and improving the adhesion between them. That is, the intermediate layer 280 functions as a primer layer.

Specifically, regardless of the method of forming the through hole 213, minute concavities and convexities are formed on the inner wall of the through hole 213. These concavities and convexities may deteriorate the adhesion between the inner surface of the through hole 213 and the penetrating electrode 251, produce a gap between the inner surface of the through hole 213 and the penetrating electrode 251, and further, when the penetrating electrode 251 is formed by sputtering or evaporation, cause insufficient formation of the penetrating electrode 251 because the materials are hard to attach to the concavities behind the convexities.

Accordingly, if the intermediate layer 280 is omitted and the penetrating electrodes 251, 271 are formed in contact with the inner surfaces of the through holes 213, 215 as in related art, a gas enters the housing space S from the outside via the through hole 213, a problem that the air-tightness of the housing space S of the package 200 can not be held or a problem that disconnection of the penetrating electrode 251 occurs arises.

The intermediate layer 280 is a layer formed for the purpose of solving the above described problems. The intermediate layer 280 is formed to fill the minute concavities and convexities on the inner surface of the through hole 213. Further, the surface (inner surface) of the intermediate layer 280 is formed by a relatively flat (smooth) surface. In other words, the intermediate layer 280 has the surface having the smaller concavities and convexities than those of the inner surface of the through hole 213 at the penetrating electrode 251 side.

Furthermore, the thickness (average thickness) of the intermediate layer 280 is not particularly limited as long as it may fill the concavities and convexities on the inner surface of the through hole 213, but preferably is about from 1 μm to 5 μm. Thereby, the concavities and convexities on the inner surface of the through hole 213 may be sufficiently filled and the thickness of the intermediate layer 280 may be suppressed. Accordingly, the space for formation of the penetrating electrode 251 within the through hole 213 may be sufficiently secured while the diameter of the through hole 213 is suppressed.

This intermediate layer 280 is formed using a material containing a glass material. The material is softened and supplied to the inner surface of the through hole 213, and thereby, the concavities and convexities on the inner surface of the through hole 213 may be filled easily and reliably, and the intermediate layer 280 having the smooth surface may be formed.

The intermediate layer 280 of the embodiment is a layer formed by hardening (solidification) of the melt of the insulator board 211. As described above, the through hole 213 is formed by laser processing. That is, the insulator board 211 is irradiated with laser, the part irradiated with laser is gasified (evaporated) and removed, and thereby, the through hole 213 is formed. In this regard, concurrently with the gradual formation of the through hole 213 from the laser application side, the part near the inner wall melts by the heat of the laser and the melt wets and spreads on the inner surface of the through hole 213 to fill the concavities and convexities on the inner surface. Therefore, the through hole 213 and the layer of the melt filing the concavities and convexities on the inner surface are formed at the same time, the layer of the melt is hardened, and thereby, the intermediate layer 280 is formed.

As described above, the melt of the insulator board 211 is hardened to form the intermediate layer 280, and thereby, the intermediate layer 280 and the insulator board 211 may be formed using the same material and the affinity of them may be improved. Accordingly, the intermediate layer 280 and the insulator board 211 are bonded more strongly with the higher adhesion.

Further, as described above, as the constituent material of the insulator board 211, the glass material is used in addition to the ceramics material. The glass material is contained, and the surface of the intermediate layer 280 may be made to be the smoother surface without concavities or convexities. Furthermore, the viscosity of the melt may be suitable for wetting and spreading on the inner surface of the through hole 213, and the intermediate layer 280 may be formed more reliably.

This intermediate layer 280 is formed between the inner surface of the through hole 213 and the penetrating electrode 251, and thereby, the adhesion of the penetrating electrode 251 to the through hole 213 may be improved and, as will be explained in the manufacturing method to be described, the penetrating electrode 251 may be formed with desired accuracy more reliably. Accordingly, the leak of the gas via the through hole 213 may be prevented, and the air-tightness of the housing space S may be reliably secured. Further, the disconnection of the penetrating electrode 251 may be prevented.

Specifically, in the embodiment, the connecting electrode 253 and the mounting electrode 255 are formed to cover the openings of the through hole 213 (penetrating electrode 251), and thereby, the through hole 213 may be closed by the connecting electrode 253 and the mounting electrode 255 and the air-tightness of the base substrate 210 may be secured more reliably.

As above, the package 200 has been explained. In the housing space S of the package 200, the vibrating element 300 is housed. The vibrating element 300 housed in the housing space S is supported by the base substrate 210 via the pair of conducting adhesive agents 291, 292. The conducting adhesive agent 291 is provided in contact with the connecting electrode 253 and the bonding pad 322, and thereby, the connecting electrode 253 and the bonding pad 322 are electrically connected via the conducting adhesive agent 291. The other conducting adhesive agent 292 is provided in contact with the connecting electrode 273 and the bonding pad 332, and thereby, the connecting electrode 273 and the bonding pad 332 are electrically connected via the conducting adhesive agent 292.

Next, a method of manufacturing the base substrate 210 (a method of manufacturing a base substrate of the embodiment of the invention) will be explained.

The method of manufacturing the base substrate 210 has a step of preparing the insulator board 211, a step of forming the through holes 213, 215 penetrating between two opposed principal surfaces of the insulator board 211 and the intermediate layers 280, 290 bonded to the inner surfaces of the through holes 213, 215 and having surfaces with the smaller concavities and convexities than those of the inner surfaces while maintaining the penetrating states of the through holes 213, 215, and a step of forming the penetrating electrodes 251, 271 within the through holes 213, 215 by depositing a metal material on the intermediate layers 280, 290. As below, these steps will be explained in detail.

Figure 5A:
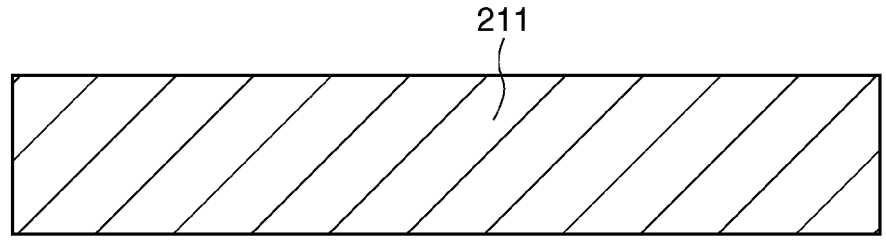
FIGS. 5A to 5C are diagrams for explanation of a method of manufacturing the base substrate shown in FIG. 4.

First, as shown in FIG. 5A, the insulator board 211 as a ceramics board is prepared. As described above, the insulator board 211 may be manufactured by forming mixture of material powder containing ceramics powder (ceramics material) and glass powder (glass material) and binder in a sheet shape by the doctor blade method or the like to obtain a ceramic green sheet, and sintering the obtained ceramic green sheet, for example. In this regard, it is preferable that the ceramic green sheet is single-layered. Thereby, the manufacturing cost may be reduced. Further, deflection and warpage of the insulator board 211 may be suppressed.

Figure 5B:
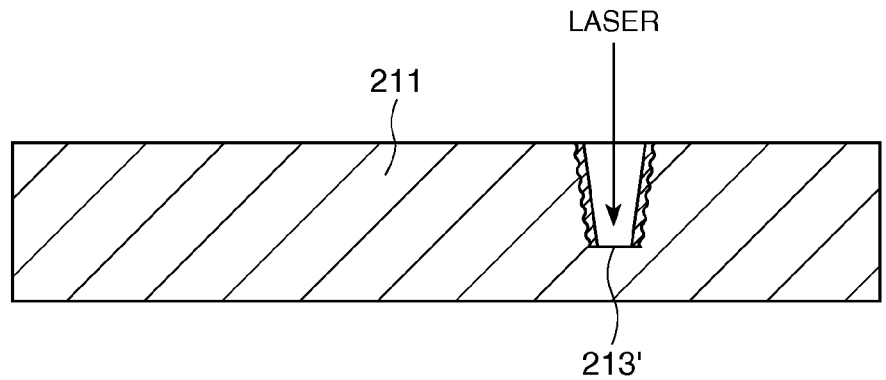
Figure 5C:
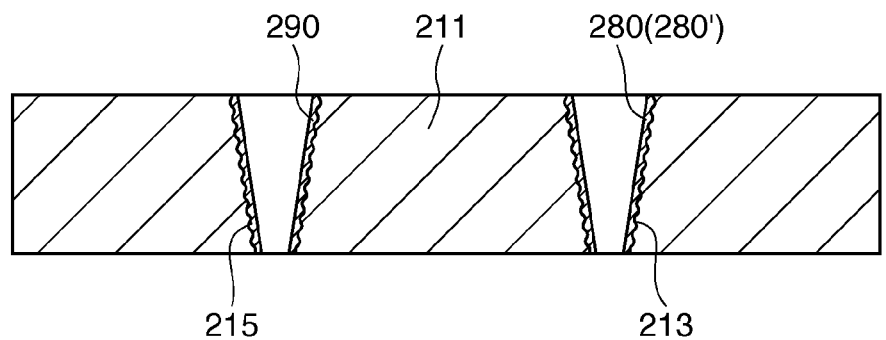

Then, as shown in FIG. 5B, the insulator board 211 is irradiated with laser from the upper surface side toward the part in which the through hole 213 is to be formed and gasifying and removing the irradiated part, and thereby, a hole 213' to be the through hole 213 is bored toward the lower surface. Concurrently, the part near the inner surface of the hole 213' melts by the heat of the laser and the melt wets and spreads to cover the inner surface of the hole 213'. That is, as the hole 213' is bored, the melt of the insulator board 211 wets and spreads on the inner surface. Then, as shown in FIG. 5C, the hole 213' reaches the lower surface of the insulator board 211, and thereby, the through hole 213 is formed and a melt layer 280' including the melt is formed on the inner surface. Then, the melt layer 280' is hardened and the intermediate layer 280 is obtained. The through hole 215 and the intermediate layer 290 are formed in the same manner. Thereby, the intermediate layers 280, 290 having surfaces with the smaller concavities and convexities than those of the inner surfaces of the through holes 213, 215 are obtained.

Figure 6A:
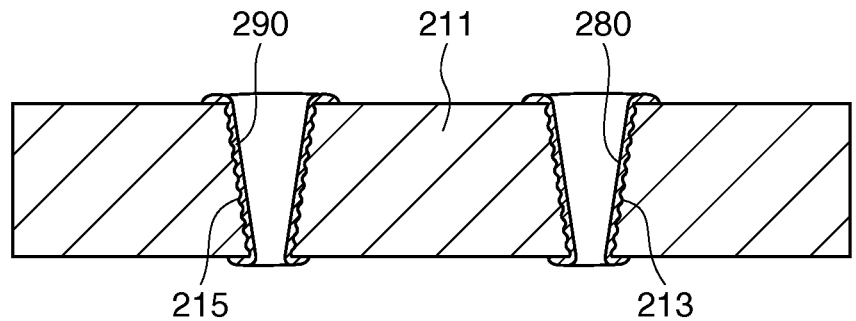
FIGS. 6A to 6C are diagrams for explanation of the method of manufacturing the base substrate shown in FIG. 4.

Note that, as shown in FIG. 6A, the melt may also wet and spread to the opening end surfaces of the through holes 213, 215 (the upper surface and the lower surface of the insulator board 211), and the intermediate layers 280, 290 may be formed in the parts. In this case, the intermediate layers 280, 290 formed on the opening end surfaces of the through hole 213 are removed by polishing.

Figure 6B:
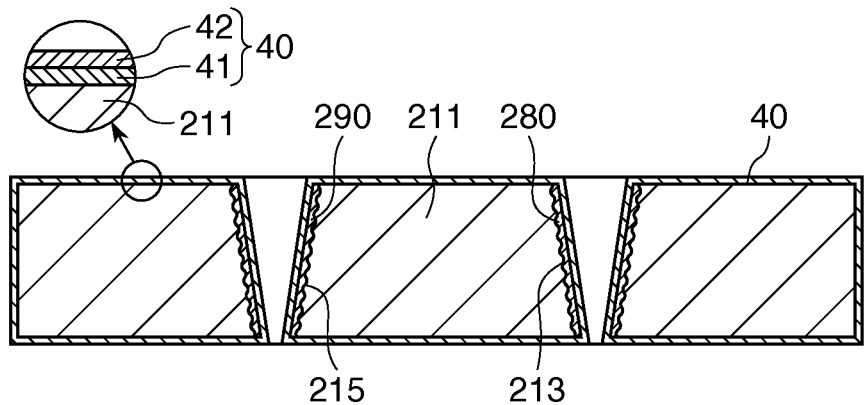

Then, as shown in FIG. 6B, a metal film 40 having conductivity is formed on the surface of the insulator board 211 by evaporation or sputtering. The metal film 40 functions as a seed layer for the subsequent electrolytic plating processing. Note that the concavities and convexities on the inner surfaces of the through holes 213, 215 are covered by the intermediate layers 280, 290, and the surfaces (smooth surfaces) of the intermediate layers 280, 290 are exposed inside of the through holes 213, 215. Accordingly, the uniform metal film 40 may be formed without irregularities inside of the through holes 213, 215.

The metal film 40 may be single-layered or multi-layered. The metal film 40 of the embodiment includes a first metal film 41 of titanium-tungsten alloy or chromium, and a second metal film 42 of copper formed on the first metal film 41. Copper plating is performed as the electrolytic plating processing as will be described later, copper is used as the constituent material of the second metal film 42, and the adhesion of the plated layer formed on the second metal film 42 may be improved. Note that the constituent materials of the first metal film 41 and the second metal film 42 are not limited to those described above.

Figure 6C:
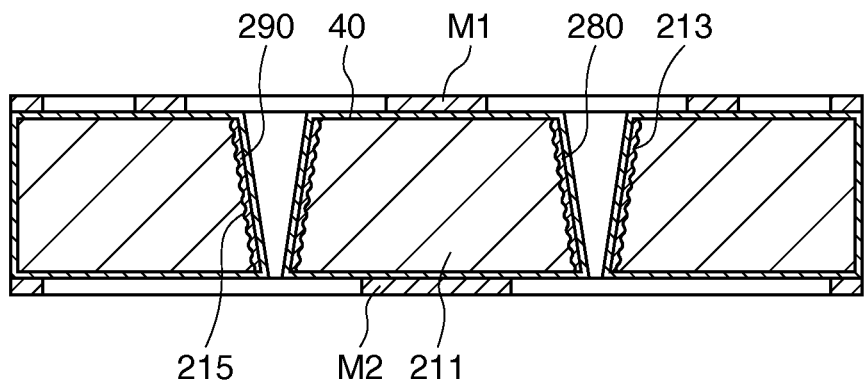
Figure 7A:
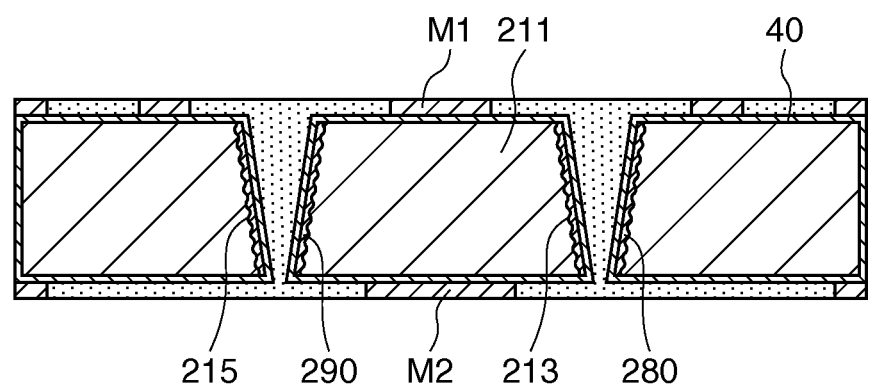
FIGS. 7A and 7B are diagrams for explanation of the method of manufacturing the base substrate shown in FIG. 4.
Figure 7B:
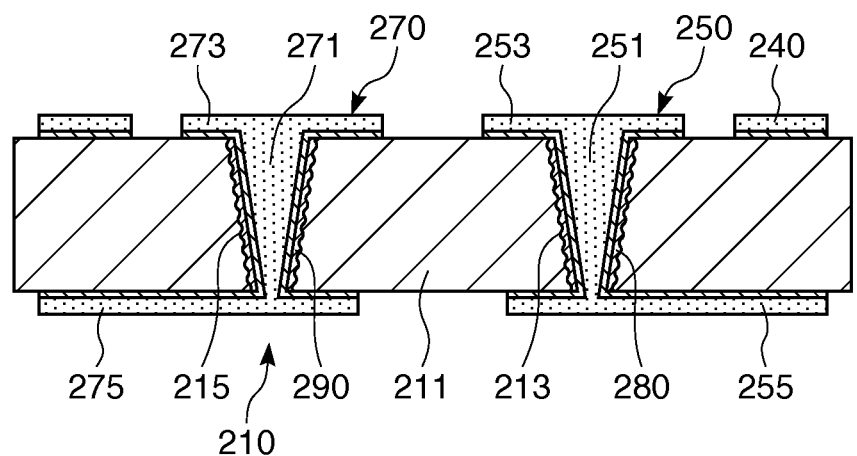

Then, as shown in FIG. 6C, a first mask M1 is formed on the upper surface of the insulator board 211, and a second mask M2 is formed on the lower surface of the insulator board 211. The first mask M1 has openings corresponding to the plan view shapes of the connecting electrodes 253, 275 and the metallization layer, and the second mask M2 has openings corresponding to the plan view shapes of the mounting electrodes 255, 275. Then, copper plating is performed on the metal film 40 by electrolytic plating processing, and thereby, as shown in FIG. 7A, a copper film 45 is grown in the parts exposed from the openings of the first and second masks. In this regard, the metal film 40 as the seed layer is uniformly formed as described above, and the copper film 45 is uniformly grown without irregularities on the metal film 40. Then, the first and second masks M1 and M2 are removed, and then, the metal film 40 exposed from the copper film 45 is removed by etching or otherwise. Thereby, the electrodes 250, 270 and the metalization layer 240 may be formed. In this manner, as shown in FIG. 7B, the base substrate 210 is obtained.

As described above, the through holes 213, 215 are formed on the insulator board 211 by laser processing, thereby, the through holes 213, 215 and the intermediate layers 280, 290 may be formed at the same time (in the same process), and thus, the manufacture of the base substrate 210 is easier. Further, the electrode 250 is formed by plating processing, thereby, the respective parts of the electrode 250 (the penetrating electrode 251, the connecting electrode 253, and the mounting electrode 255) may be integrally formed, and thus, the formation of the electrode 250 is easier (the same applies to the electrode 270).

Note that, in the above described manufacturing method, the electrodes 250, 270 are formed by forming the first and second masks M1 and M2, then, forming the copper film 45, and then, removing the unnecessary parts of the metal film 40, however, not limited to that. For example, the electrodes 250, 270 may be formed by forming the copper film 45 uniformly on th metal film 40, forming the first and second masks M1 and M2 on the copper film 45, and etching the copper film 45 and the metal film 40 via the first and second masks M1 and M2.

Second Embodiment

Next, the second embodiment of the electronic device of the invention will be explained.

Figure 8:
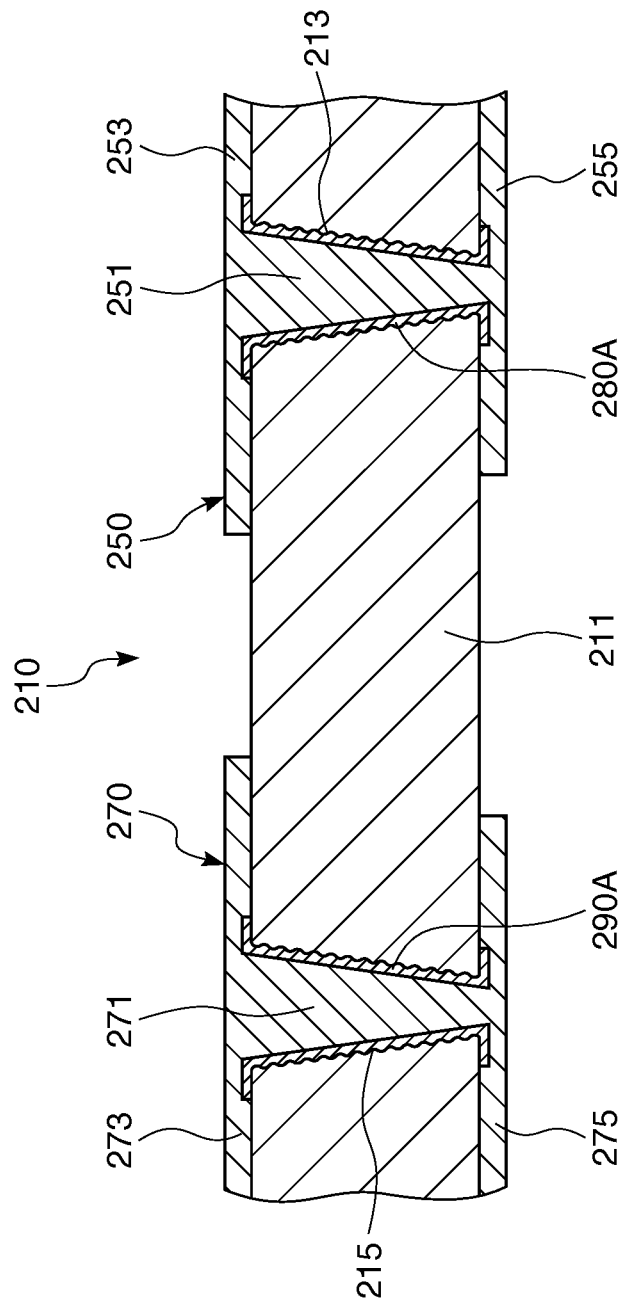
FIG. 8 is an enlarged sectional view of a base substrate of a second embodiment of the electronic device of the invention.
Figure 9A:
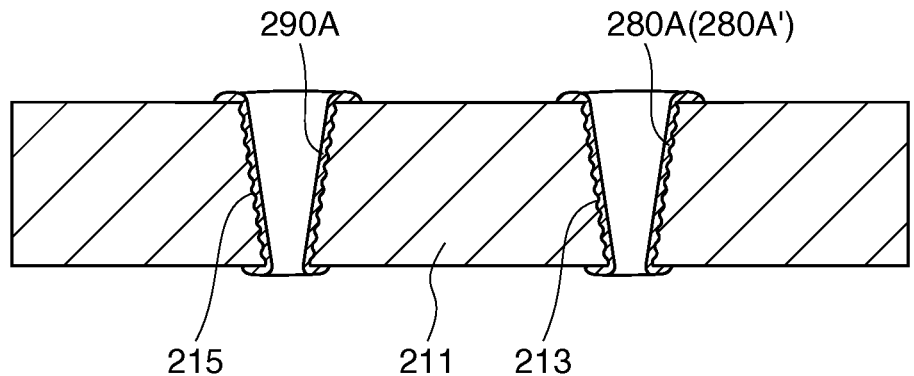
FIGS. 9A and 9B are sectional views for explanation of a method of manufacturing the base substrate shown in FIG. 8.
Figure 9B:
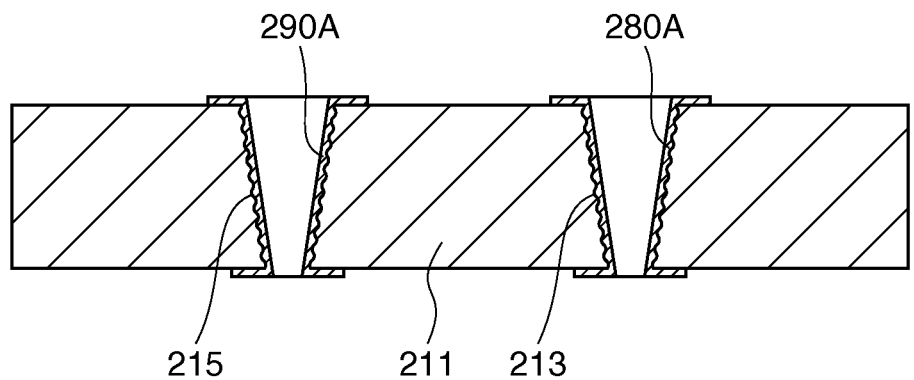

FIG. 8 is an enlarged sectional view of a base substrate of the second embodiment of the electronic device of the invention, and FIGS. 9A and 9B are sectional views for explanation of a method of manufacturing the base substrate shown in FIG. 8.

As below, regarding the second embodiment, the difference from the above described embodiment will be centered for explanation and the explanation of the same items will be omitted.

The electronic device according to the second embodiment of the invention is the same as the electronic device of the first embodiment except that the formation ranges of the intermediate layers are different. The same configurations as those of the above described first embodiment have the same signs.

As shown in FIG. 8, an intermediate layer 280A is formed to extend from the inner surface of the through hole 213 to the opening end surfaces of the through hole 213, and extend to between the upper surface of the insulator board 211 and the connecting electrode 253 and between the lower surface of the insulator board 211 and the mounting electrode 255. That is, the intermediate layer 280A is formed on the inner surface of the through hole 213, around the opening of the through hole 213 on the upper surface of the insulator board 211, and around the opening of the through hole 213 on the lower surface of the insulator board 211.

Similarly, an intermediate layer 290A is formed to extend from the inner surface of the through hole 215 to the opening end surfaces of the through hole 215.

The intermediate layers 280A, 290A have the above described configurations, thereby, the intermediate layers 280A, 290A may intervene between the upper surface and the lower surface of the insulator board 211 and the electrodes 250, 270 (the connecting electrodes 253, 273 and the mounting electrodes 255, 275), and thus, the adhesion between the insulator board 211 and the electrodes 250, 270 may be improved and production of gaps between them may be prevented more effectively. Further, the boundary parts between the inner surfaces of the through holes 213, 215 and the upper and lower surfaces of the insulator board 211 are cornered and gaps may be easily formed therein, however, the parts may be covered by the intermediate layers 280A, 290A and thereby, the above described formation of gaps may be suppressed. Therefore, the base substrate 210 may exert more advantageous air-tightness.

Next, a method of manufacturing a base substrate 210A will be explained. When the through hole 213 is formed by laser processing as in the first embodiment, the melt of the insulator board 211 wets and spreads on the inner surface and the opening end surfaces of the through hole 213 and a melt layer 280A' is formed. Then, the melt layer 280A' is hardened, and thereby, as shown in FIG. 9A, the intermediate layer 280A extending from the inner surface to the opening end surfaces of the through hole 213 is obtained. The intermediate layer 290A is formed in the same manner.

As shown in FIG. 9A, the thicknesses of the intermediate layers 280A, 290A formed on the opening end surfaces may be uneven, and, in this case, as shown in FIG. 9B, the thicknesses of the intermediate layers 280A, 290A are made even by polishing or otherwise. Then, the electrodes 250, 270 are formed by forming the metal layer as the seed layer, forming the first and second masks on the metal layer, and performing the electrolytic plating processing in the same manner as that of the above described first embodiment. Thereby, the base substrate 210A is obtained.

According to the second embodiment, the same advantages as those of the above described first embodiment may be exerted.

Note that, in the above described second embodiment, the intermediate layers 280A, 290A are formed on both of the opening end surfaces of the through holes 213, 215, however, for example, the intermediate layers 280A, 290A may be formed on only one of the upper opening end surface and the lower opening end surface.

Third Embodiment

Next, the third embodiment of the electronic device of the invention will be explained.

Figure 10A:
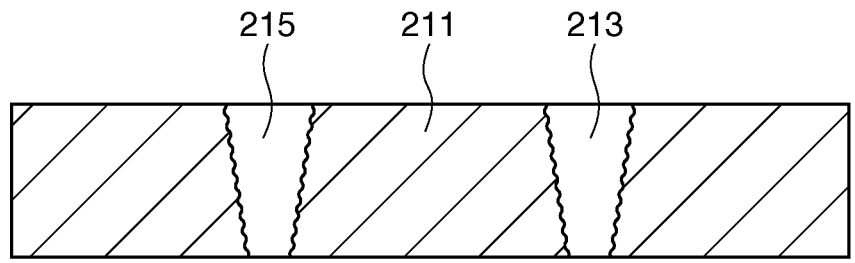
FIGS. 10A to 10C are sectional views for explanation of a method of manufacturing a base substrate of a third embodiment of the electronic device of the invention.
Figure 10B:
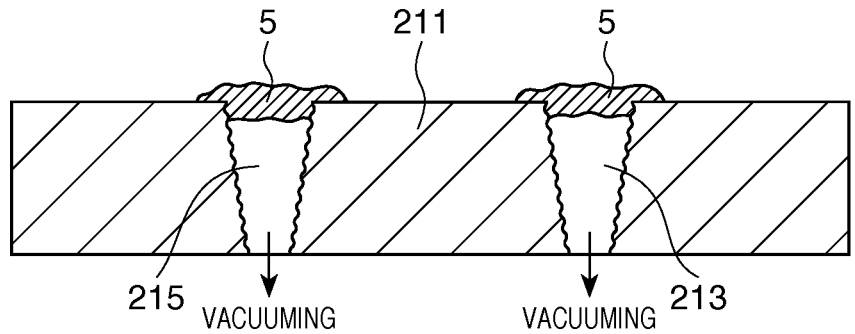
Figure 10C:
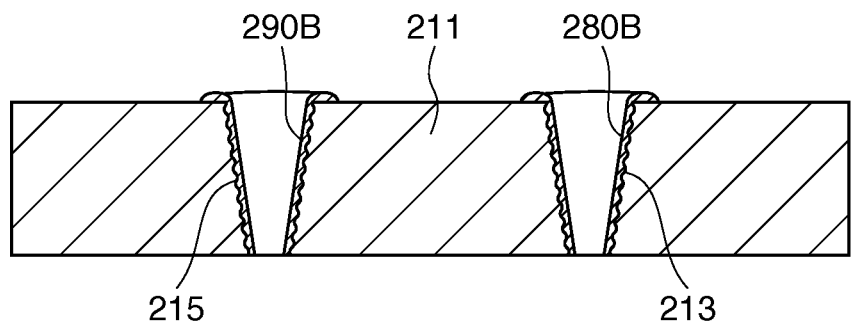

FIGS. 10A to 10C are sectional views for explanation of a method of manufacturing a base substrate of the third embodiment of the electronic device of the invention.

As below, regarding the third embodiment, the difference from the above described embodiments will be centered for explanation and the explanation of the same items will be omitted.

The electronic device according to the third embodiment of the invention is the same as the electronic device of the first embodiment except that the method of forming the intermediate layers is different. The same configurations as those of the above described first embodiment have the same signs.

For example, in the above described first embodiment, when the insulator board 211 does not contain the glass material, if the through holes 213, 215 are formed by laser processing, the intermediate layers 280, 290 containing the glass material are not formed at the same time. In this case, intermediate layers 280B, 290B may be formed in the manner of the embodiment.

First, as shown in FIG. 10A, the through holes 213, 215 are formed on the insulator board 211 by laser processing.

Then, as shown in FIG. 10B, low-melting-point glass in a liquid state (a glass material in paste form) 5 is applied to the upper surface of the insulator board 211 to cover the upper openings of the through holes 213, 215 while vacuuming is performed from the lower openings of the through holes 213, 215.

Then, as shown in FIG. 10C, the low-melting-point glass 5 wets and spreads on the inner surfaces toward the lower openings of the through holes 213, 215 and is hardened, and thereby, the intermediate layers 280B, 290B may be formed on the inner surfaces of the through holes 213, 215. Then, the electrodes 250, 270 are formed in the same manner as that of the above described first embodiment, and thereby, the base substrate 210 is obtained.

Note that the method of applying the low-melting-point glass 5 is not particularly limited, but, for example, screen printing or the like may be used. Further, as the low-melting-point glass 5, for example, $P_2O_5$—CuO—ZnO-based low-melting-point glass, $P_2O_5$—SnO-based low-melting-point glass, $B_2O_3$—ZnO—$Bi_2O_3$—$Al_2O_3$-based low-meltingpoint glass, or the like may be used. Or, in place of the low-melting-point glass 5, paste glass of mixture of glass powder and binder may be used.

According to the third embodiment, the same advantages as those of the above described first embodiment may be exerted.

Fourth Embodiment

Next, the fourth embodiment of the electronic device of the invention will be explained.

Figure 11:
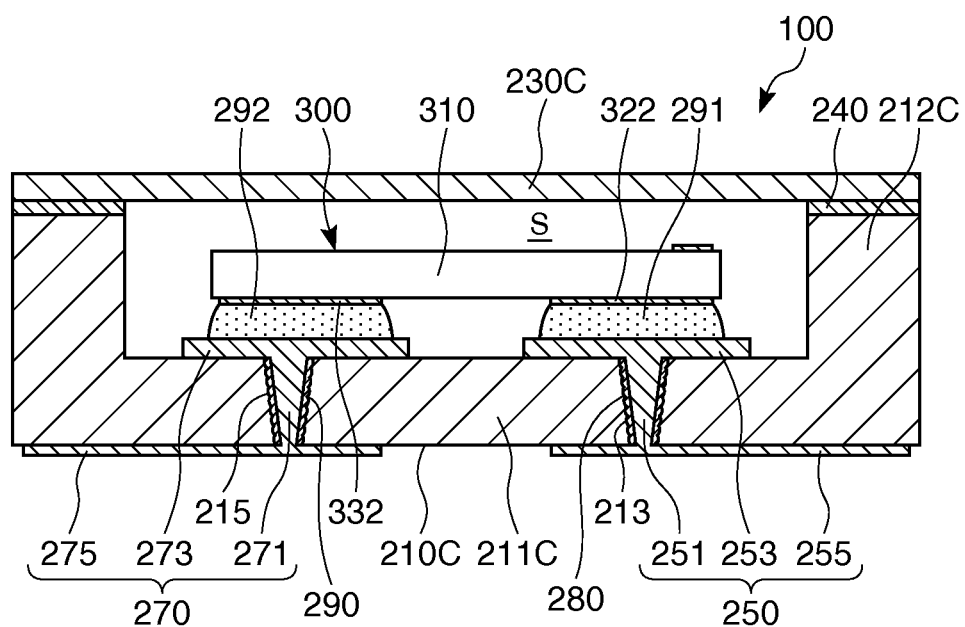
FIG. 11 is a sectional view showing a fourth embodiment of the electronic device of the invention.

FIG. 11 is a sectional view showing the fourth embodiment of the electronic device of the invention.

As below, regarding the fourth embodiment, the difference from the above described embodiments will be centered for explanation and the explanation of the same items will be omitted.

The electronic device according to the fourth embodiment of the invention is the same as the electronic device of the first embodiment except that the configuration of the package is different. The same configurations as those of the above described first embodiment have the same signs.

As shown in FIG. 11, a base substrate 210C has a cavity shape with a recess part opening to the upper surface. Specifically, the base substrate 210C has an insulator board 211C in a plate shape and a wall part 212C in a frame shape stood from the edge part of the upper surface of the insulator board 211C. On the other hand, a lid 230C has a plate shape and the lid 230C is bonded to the upper surface (opening end surface) of the base substrate 210C to cover the recess part opening of the base substrate 210C.

According to the fourth embodiment, the same advantages as those of the above described first embodiment may be exerted.

2. Electronic Apparatus

Next, an electronic apparatus to which the electronic device of the embodiment of the invention is applied will be explained in detail with reference to FIGS. 12 to 14.

Figure 12:
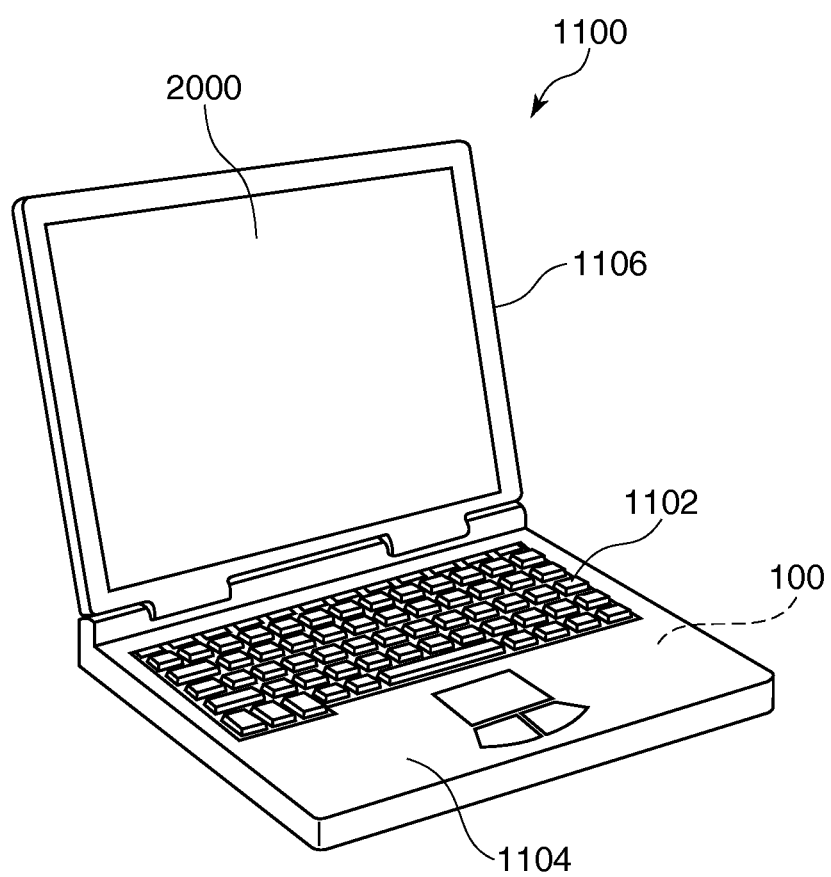
FIG. 12 is a perspective view showing a configuration of a mobile (or notebook) personal computer to which an electronic apparatus including the electronic device of the invention is applied.

FIG. 12 is a perspective view showing a configuration of a mobile (or notebook) personal computer to which the electronic apparatus having the electronic device of the embodiment of the invention is applied. In the drawing, a personal computer 1100 includes a main body unit 1104 having a keyboard 1102 and a display unit 1106 having a display part 2000, and the display unit 1106 is rotatably supported via a hinge structure part with respect to the main body unit 1104. The personal computer 1100 contains the electronic device 100 that functions as a filter, a resonator, a reference clock, or the like.

Figure 13:
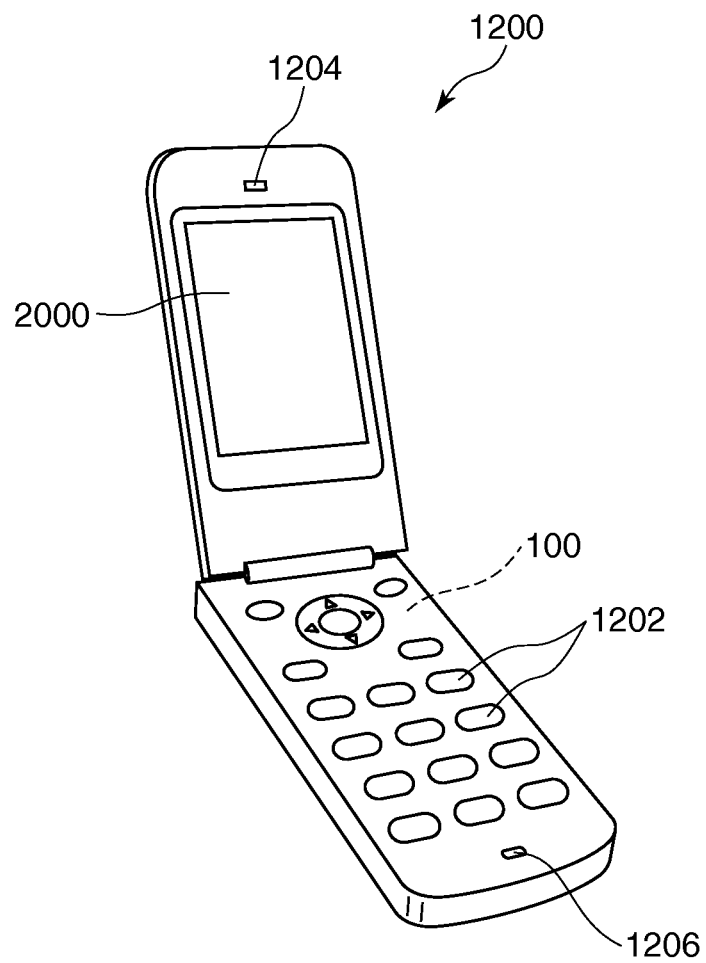
FIG. 13 is a perspective view showing a configuration of a cellular phone (including PHS) to which the electronic apparatus including the electronic device of the invention is applied.

FIG. 13 is a perspective view showing a configuration of a cellular phone (including a PHS) to which the electronic apparatus having the electronic device of the embodiment of the invention is applied. In the drawing, a cellular phone 1200 includes a plurality of operation buttons 1202, an ear piece 1204, and a mouthpiece 1206, and a display part 2000 is provided between the operation buttons 1202 and the ear piece 1204. The cellular phone 1200 contains the electronic device 100 that functions as a filter, a resonator, or the like.

Figure 14:
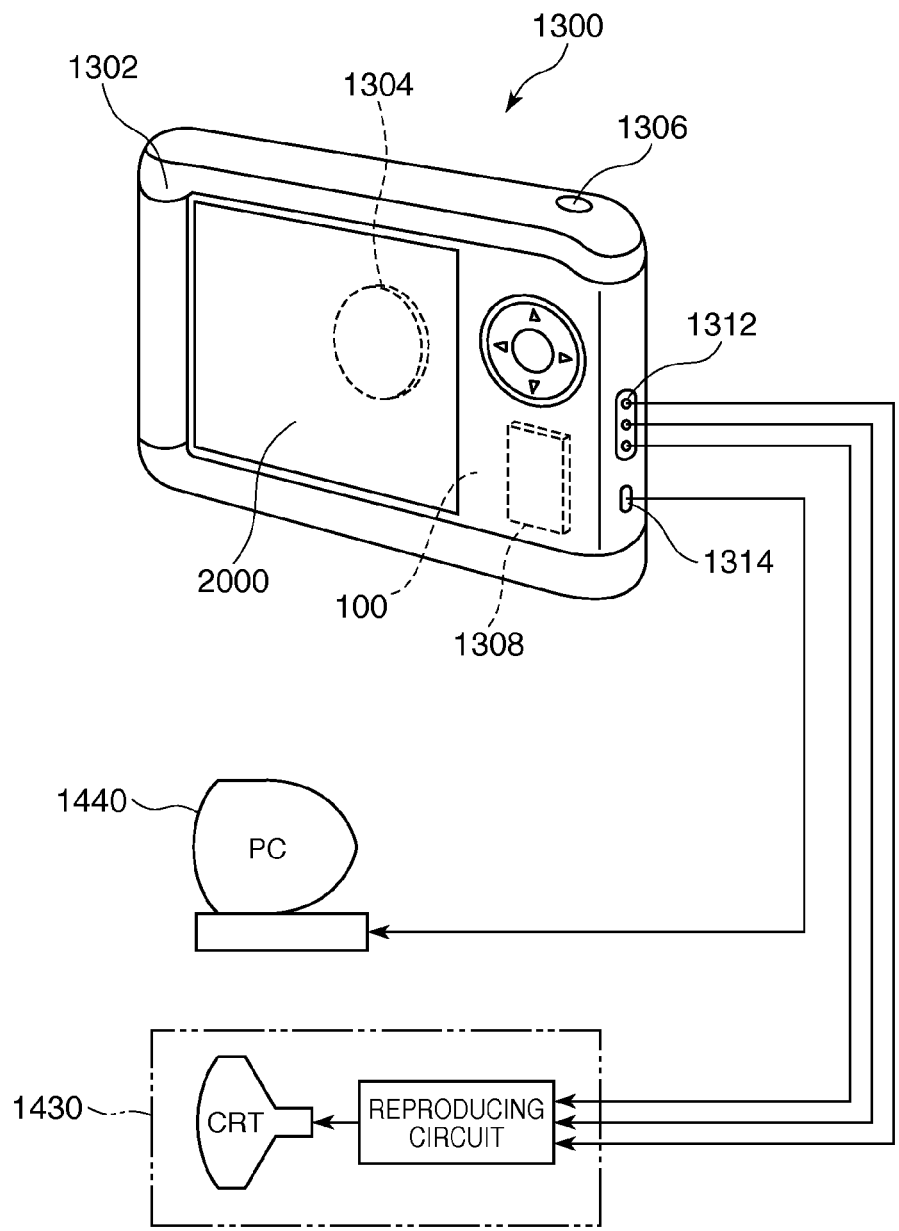
FIG. 14 is a perspective view showing a configuration of a digital still camera to which the electronic apparatus including the electronic device of the invention is applied.

FIG. 14 is a perspective view showing a configuration of a digital still camera to which the electronic apparatus having the electronic device of the embodiment of the invention is applied. Note that, in the drawing, connection to an external device is simply shown. Here, in a typical camera, a silver halide photographic film is exposed to light by an optical image of a subject and, on the other hand, a digital still camera 1300 photoelectrically converts an optical image of a subject using an image sensing device such as a CCD (Charge Coupled Device) and generates imaging signals (image signals).

On a back surface of a case (body) 1302 in the digital still camera 1300, a display part is provided and adapted to display based on the imaging signals by the CCD, and the display part functions as a finder that displays the subject as an electronic image. Further, on the front side (the rear side in the drawing) of the case 1302, a light receiving unit 1304 including an optical lens (imaging system), the CCD, etc. is provided.

When a photographer checks the subject image displayed on the display part and presses down a shutter button 1306, the imaging signals of the CCD at the time are transferred and stored into a memory 1308. Further, in the digital still camera 1300, a video signal output terminal 1312 and an input/output terminal for data communication 1314 are provided on the side surface of the case 1302. Furthermore, as shown in the drawing, a television monitor 1430 is connected to the video signal output terminal 1312 and a personal computer 1440 is connected to the input/output terminal for data communication 1314, respectively, according to need. In addition, by predetermined operation, the imaging signals stored in the memory 1308 are output to the television monitor 1430 and the personal computer 1440. The digital still camera 1300 contains the electronic device 100 that functions as a filter, a resonator, or the like.

Note that the electronic apparatus including the electronic device of the embodiment of the invention may be applied not only to the personal computer (mobile personal computer) in FIG. 12, the cellular phone in FIG. 13, and the digital still camera in FIG. 14 but also to an inkjet ejection device (for example, an inkjet printer), a laptop personal computer, a television, a video camera, a video tape recorder, a car navigation system, a pager, a personal digital assistance (with or without communication function), an electronic dictionary, a calculator, an electronic game machine, a word processor, a work station, a videophone, a security television monitor, electronic binoculars, a POS terminal, a medical device (for example, an electronic thermometer, a sphygmomanometer, a blood glucose meter, an electrocardiographic measurement system, an ultrasonic diagnostic system, or an electronic endoscope), a fish finder, various measurement instruments, meters and gauges (for example, meters for vehicles, airplanes, and ships), a flight simulator, etc.

As above, the base substrate, the electronic device, and the method of manufacturing the base substrate of the invention have been explained according to the respective illustrated embodiments, however, the invention is not limited to those. The configurations of the respective parts may be replaced by arbitrary configurations having the same functions. Further, other arbitrary configurations may be added. Furthermore, the respective embodiments may be appropriately combined.

Further, in the above described embodiments, the configurations including vibrating elements as electronic components have been explained, however, the electronic components may include, but not be limited to, a gyro sensor or an IC.

The entire disclosure of Japanese Patent Application No. 2012-104087, filed Apr. 27, 2012 is expressly incorporated by reference herein.

What is claimed is:
1. A base substrate comprising:
   an insulator board comprising a through hole penetrating between two opposed principal surfaces;
   a penetrating electrode provided within the through hole; and an intermediate layer sandwiched between an inner surface of the through hole and the penetrating electrode and comprising a surface with smaller concavities than the inner surface, wherein the insulating board and the intermediate layer are made of the same material, the insulating board and the intermediate layer are in different states of matter, a thickness of the intermediate layer is in a range of 1 μm to 5 μm, and the intermediate layer is automatically formed when the through hole is formed by a laser beam.

2. The base substrate according to claim 1, further comprising a principal surface-side electrode electrically connected to the penetrating electrode and covering the through hole at least at a side of one principal surface of the two principal surfaces.

3. The base substrate according to claim 2, wherein the intermediate layer extends to between the principal surface-side electrode and the one principal surface.

4. An electronic device comprising:
the base substrate according to claim 2, and
an electronic component mounted on the base substrate.

5. The base substrate according to claim 1, wherein the insulator board contains a glass material.

6. An electronic device comprising:
the base substrate according to claim 1; and
an electronic component mounted on the base substrate.

7. A method of manufacturing a base substrate comprising:
preparing an insulator board;
forming a through hole penetrating between two opposed principal surfaces of the insulator board and an intermediate layer bonded to an inner surface of the through hole at the same time, and the intermediate layer comprising a surface with smaller concavities than the inner surface while maintaining a penetrating state of the through hole; and
forming a penetrating electrode within the through hole by depositing a metal material on the intermediate layer, wherein
the intermediate layer is automatically formed when the through hole is formed by a laser beam, and
a thickness of the intermediate layer is in a range of 1 μm to 5 μm.

8. The method of manufacturing the base substrate according to claim 7, wherein the insulator board includes a ceramics material, and
forming the through hole and the intermediate layer includes melting and hardening a part of the insulator board.

9. The method of manufacturing the base substrate according to claim 7, wherein, forming the through hole and the intermediate layer includes forming the through hole and the intermediate layer by irradiating the insulator substrate with the laser beam.

* * * * *